US010209302B2

(12) United States Patent
Lin et al.

(10) Patent No.: US 10,209,302 B2
(45) Date of Patent: Feb. 19, 2019

(54) INTERFACE CHIP AND BUILT-IN SELF-TEST METHOD THEREFOR

(71) Applicant: VIA TECHNOLOGIES, INC., New Taipei (TW)

(72) Inventors: Yu-Lung Lin, New Taipei (TW); Po-Chou Lin, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 4 days.

(21) Appl. No.: 14/989,035

(22) Filed: Jan. 6, 2016

(65) Prior Publication Data

US 2016/0313399 A1 Oct. 27, 2016

(30) Foreign Application Priority Data

Apr. 22, 2015 (TW) .............................. 104112807 A

(51) Int. Cl.
*G01R 31/317* (2006.01)
*G01R 31/3187* (2006.01)

(52) U.S. Cl.
CPC .... *G01R 31/31716* (2013.01); *G01R 31/3187* (2013.01)

(58) Field of Classification Search
CPC .... G01R 31/3187; G11C 29/16; G11C 29/44; H05K 999/99; G06F 11/27; G05D 1/12; G05D 1/0676; G05D 1/105; G01C 23/00
(Continued)

(56) References Cited

U.S. PATENT DOCUMENTS 5,802,105 A * 9/1998 Tiedemann, Jr. ......... H04L 1/20
370/242
6,002,718 A * 12/1999 Roth ..................... H03M 5/145
341/106
(Continued)

FOREIGN PATENT DOCUMENTS

CN 1728626 A 2/2006
CN 1795393 A 6/2006
(Continued)

OTHER PUBLICATIONS

Chinese language office action dated Dec. 13, 2016, issued in application No. TW 104112807.
(Continued)

*Primary Examiner* — Albert Decady
*Assistant Examiner* — Enam Ahmed
(74) *Attorney, Agent, or Firm* — McClure, Qualey & Rodack, LLP

(57) ABSTRACT

An interface chip with a built-in self-test mechanism. An electrical physical layer (EPHY) provides a signal to a transmission terminal of the interface chip, and gets a signal from a reception terminal of the interface chip. A digital code generator generates a source code to be scrambled as a scrambled code and then encoded by an encoder and conveyed to the EPHY to be converted into the signal that is provided to the transmission terminal by the EPHY. The EPHY further converts the signal received from the reception terminal into a receiving code to be decoded by a decoder as a decoded code and then descrambled by the descrambler as a restored code. When the transmission terminal is coupled back to the interface chip via the reception terminal, the code checker checks whether the restored code matches the source code.

17 Claims, 3 Drawing Sheets

(58) Field of Classification Search
USPC .......................................................... 714/733
See application file for complete search history.

(56) References Cited

U.S. PATENT DOCUMENTS

| | | | | |
|---|---|---|---|---|
| 6,819,609 | B2 * | 11/2004 | Ozawa | G11C 29/16 365/189.15 |
| 6,836,515 | B1 | 12/2004 | Kay et al. | |
| 7,281,184 | B2 * | 10/2007 | Boldt | G01R 31/3187 714/703 |
| 7,340,662 | B1 * | 3/2008 | McElwee | G01R 31/3167 714/733 |
| 7,444,558 | B2 * | 10/2008 | Mitbander | G06F 11/221 375/221 |
| 7,478,302 | B2 | 1/2009 | Veendrick | |
| 7,519,886 | B2 | 4/2009 | Tsao et al. | |
| 7,673,200 | B2 | 3/2010 | Jan et al. | |
| 7,698,088 | B2 | 4/2010 | Sul et al. | |
| 7,716,542 | B2 * | 5/2010 | Chang | G01R 31/318552 365/201 |
| 7,774,667 | B2 * | 8/2010 | Saito | G11C 29/1201 714/718 |
| 8,598,898 | B2 | 12/2013 | Sul et al. | |
| 9,384,108 | B2 | 7/2016 | McIlvain et al. | |
| 9,432,298 | B1 * | 8/2016 | Smith | H04L 49/9057 |
| 2006/0171283 | A1 * | 8/2006 | Vijayan | H04L 1/0045 369/94 |
| 2007/0033471 | A1 * | 2/2007 | Damodaran | G01R 31/31724 714/733 |
| 2008/0117886 | A1 * | 5/2008 | Kim | H04L 12/4625 370/338 |
| 2008/0202623 | A1 * | 8/2008 | DeAngelis | D06N 3/0086 139/425 R |
| 2013/0278453 | A1 * | 10/2013 | Steensgaard-Madsen | H03M 1/0668 341/110 |
| 2014/0156253 | A1 | 6/2014 | McIlvain et al. | |
| 2014/0160944 | A1 | 6/2014 | Venkatesan et al. | |
| 2016/0174226 | A1 | 6/2016 | Porat et al. | |

FOREIGN PATENT DOCUMENTS

| | | | |
|---|---|---|---|
| CN | 101183327 A | 5/2008 | |
| CN | 102752254 A | 10/2012 | |
| CN | 103154753 A | 6/2013 | |
| CN | 103853639 A | 6/2014 | |
| TW | I363184 | 5/2008 | |
| TW | 201101024 A | 1/2011 | |
| TW | 201306543 | 2/2013 | |
| TW | I477139 | 3/2015 | |
| WO | WO 2008052858 A2 * | 5/2008 | ............ H03M 13/03 |

OTHER PUBLICATIONS

Chinese language office action dated Mar. 27, 2017, issued in application No. CN 201510243987.4.

* cited by examiner

INTERFACE CHIP AND BUILT-IN
// SELF-TEST METHOD THEREFOR

CROSS REFERENCE TO RELATED APPLICATIONS

This Application claims priority of Taiwan Patent Application No. 104112807, filed on Apr. 22, 2015, the entirety of which is incorporated by reference herein.

BACKGROUND OF THE INVENTION

Field of the Invention

The present invention relates to test technology for an interface chip.

Description of the Related Art

In conventional techniques, an interface chip is tested by automatic test equipment (ATE). The interface chip to be tested is put onto the ATE, and the ATE checks the signal accuracy at a transmission terminal of the interface chip, and it also tests the receiver function of the interface chip by generating test data for the interface chip and coupling the test data to the interface chip by a reception terminal of the interface chip.

Because the data rate of interface chips has been increased considerably by developments in semiconductor technology, a more enhanced ATE is required. For example, an ATE for an interface chip using a high-speed universal serial bus, such as USB 3.0, USB 3.1 and so on, is very complex and expensive.

BRIEF SUMMARY OF THE INVENTION

A built-in self-test technology for an interface chip is disclosed.

An interface chip in accordance with an exemplary embodiment of the disclosure includes an electrical physical layer, a digital code generator, a scrambler, an encoder, a decoder, a descrambler, and a code checker. The electrical physical layer provides a signal to a transmission terminal of the interface chip, and receives a signal from the reception terminal of the interface chip. The digital code generator generates a source code. The scrambler scrambles the source code to generate a scrambled code. The encoder encodes the scrambled code and outputs an encoded and scrambled code to the electrical physical layer to be converted to the signal that is provided to the transmission terminal by the electrical physical layer. The decoder is operative to decode a receiving code to generate a decoded code. The receiving code is received from the electrical physical layer and the electrical physical layer converts the signal received from the reception terminal to the receiving code. The descrambler descrambles the decoded code to generate a restored code. The code checker receives the restored code. When the transmission terminal is coupled back to the interface chip via the reception terminal, the code checker checks whether the restored code matches the source code. In this manner, the interface chip uses built-in logical and electrical blocks to complete a transmission and reception test without using any additional automatic test equipment.

In another exemplary embodiment, a built-in test method for an interface chip includes the following steps: coupling a transmission terminal of the interface chip back to the interface chip via the reception terminal of the interface chip; using a digital code generator of the interface chip to generate a source code; using a scrambler of the interface chip to scramble the source code to generate a scrambled code; using an encoder of the interface chip to encode the scrambled code to generate an encoded and scrambled code; conveying the encoded and scrambled code to an electrical physical layer of the interface chip to be converted to a signal that is provided to the transmission terminal and output from the interface chip and then coupled back to the interface chip via the reception terminal and converted to a receiving code by the electrical physical layer; using a decoder of the interface chip to decode the receiving code to generate a decoded code; using a descrambler of the interface chip to descramble the decoded code to generate a restored code; and using a code checker of the interface chip to check whether the restored code matches the source code.

An interface chip in accordance with another exemplary embodiment of the disclosure includes a digital code generator and a code checker. The digital code generator generates a source code. The code checker receives a restored code and the source code. The code checker checks whether the restored code matches the source code when the transmission terminal of the interface chip is coupled back to the interface chip via the reception terminal of the interface chip. The resource code is scrambled and encoded and then output from the interface chip via the transmission terminal and coupled back to the interface chip via the reception terminal and then decoded and descrambled to the restored code.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
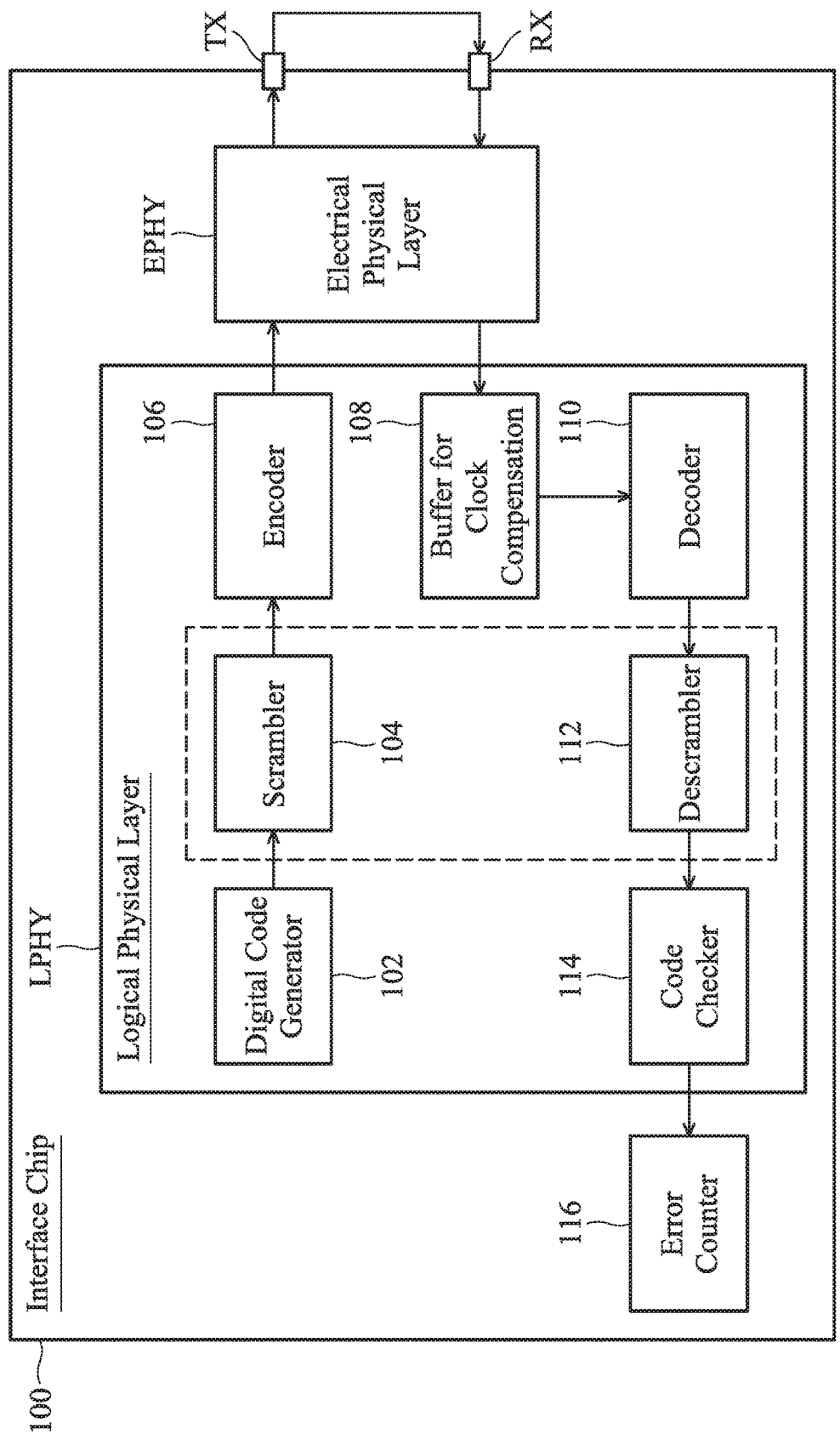
FIG. 1 is a block diagram depicting an interface chip 100 in accordance with an exemplary embodiment of the disclosure.

FIG. 1 is a block diagram depicting an interface chip 100 in accordance with an exemplary embodiment of the disclosure. The interface chip 100 includes an electrical physical layer EPHY and a logical physical layer LPHY. The electrical physical layer EPHY is operative to provide a signal to a transmission terminal TX of the interface chip 100 and receive a signal from a reception terminal RX of the interface chip 100. The interface chip 100 has a built-in self-test function. As shown, the transmission terminal TX of the interface chip 100 is coupled back to the interface chip 100 via the reception terminal RX of the interface chip 100 for the built-in self-test function. The signal transmitted from the transmission terminal TX of the interface chip 100 is received by the interface chip 100 itself via the reception terminal RX of the interface chip 100. Thus, the interface chip 100 is capable of self-testing. Complex and expensive automatic test equipment is not required.

As shown, the logical physical layer LPHY of the interface chip 100 includes a digital code generator 102, a scrambler 104, an encoder 106, a buffer 108 for clock compensation, a decoder 110, a descrambler 112 and a code checker 114. The digital code generator 102 generates a source code to the scrambler 104. The scrambler 104 scrambles the source code to generate a scrambled code. The encoder 106 encodes the scrambled code and the encoded and scrambled code is converted by the electrical physical layer EPHY to form the signal that is provided to the transmission terminal TX of the interface chip 100. The signal output from the transmission terminal TX is coupled back to the reception terminal RX by the signal test established for the self-testing, and is further converted to a receiving code by the electrical physical layer EPHY. The receiving code is conveyed to the buffer 108 for clock compensation and then to the decoder 110 to be decoded to a decoded code. The descrambler 112 descrambles the decoded code to generate a restored code. The code checker 114 checks whether the restored code matches the source code. Because of the scrambler 104 and the descrambler 112, the signal transmission and reception of the interface chip 100 are tested by a variety of test patterns derived from one single source code. This means that the code checker 114 can simply check the restored code by only comparing the restored code with the unique source code. Additional and expensive registers storing various test patterns are not required for the built-in self-test function of the interface chip 100. The digital code generator 102 and the code checker 114 are also quite simple.

As shown in FIG. 1, the interface chip 100 has an error counter 116. In an exemplary embodiment, the error counter 116 is initialized to zero. The enabled error counter 116 changes (e.g. increases progressively) a count of the error counter 116 when the code checker 114 determines that the restored code and the source code do not match. The count of the error counter 116 is used in determining whether the interface chip 100 operates normally. On the other hand, the enabled error counter 116 does not change the count when the code checker 114 determines that the restored code matches the source code. When a built-in self-test procedure of the interface chip 100 is finished and the error counter 116 is still zero, it means that the transmission and reception of the interface chip 100 work normally. The non-zero error counter 116 shows that the transmission and reception of the interface chip 100 are broken.

In addition to coupling the transmission terminal TX back to the interface chip 100 via the reception terminal RX, the digital code generator 102 generates a specific symbol to trigger the code checker 114 to start comparing the restored code with the source code and to trigger the error counter 116 to start counting. In an exemplary embodiment, the digital code generator 102 repeats the generation of a scramble/descramble seed reset signal SYNC_OS several times, to be processed by the scrambler 104, the encoder 106, and the electrical physical layer EPHY, and then output by the interface chip 100 via the transmission terminal TX and coupled back to the interface chip 100 via the reception terminal RX and processed by the electrical physical layer EPHY, the buffer 108 for clock compensation, the decoder 110, the descrambler 112 and the code checker 114. Corresponding to the digital code generator 102, the code checker 114 detects the scramble/descramble seed reset signal SYNC_OS several times and then the code checker 114 starts comparing the restored code with the source code and the error counter 116 starts counting. In another exemplary embodiment, the code checker 114 starts comparing the restored code with the source code and the error counter 116 starts counting after the digital code generator 102 is enabled or when digital code generator 102 repeats the generation of the scramble/descramble seed reset symbol SYNC_OS several times. The blocks shown in the logical physical layer LPHY of FIG. 1 are not limited to operating only for the built-in self-test function. When the transmission terminal TX is not coupled back to the interface chip 100 via the reception terminal RX, the blocks of the logical physical layer LPHY shown in FIG. 1 may also work in other operations (e.g., referring to the operations of the logical physical layer of a USB 3.0 or USB 3.1 interface). In another exemplary embodiment, the digital code generator 102 may further include a communication pin to inform the code checker 114 of the repeatedly generated scramble/descramble seed reset symbol SYNC_OS.

According to the reset symbol SYNC_OS, the scramble and descramble seeds of the scrambler 104 and the descrambler 112 are reset. In an exemplary embodiment, the scrambler 104 and the descrambler 112 do not scramble and descramble the reset symbol SYNC_OS.

Figure 2:
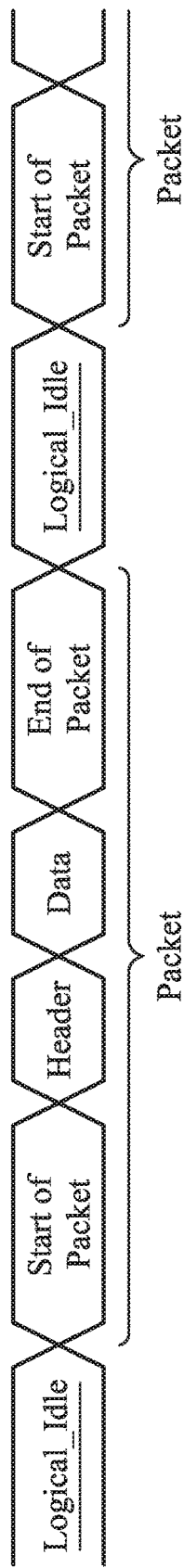
FIG. 2 shows the logical idle symbol Logical_Idle.

In an exemplary embodiment, the digital code generator 102 outputs a logical idle symbol Logical_Idle as the source code. When the code checker 114 determines that the restored code is the logical idle symbol Logical_Idle, the error counter 116 is not changed (e.g. not increased or decreased progressively). FIG. 2 shows the logical idle symbol Logical_Idle. The interface chip 100 transmits data in packet. Each packet includes the following information: the start of the packet, header, data, and the end of the packet. The logical idle symbol Logical_Idle is inserted into separate packet. Note that it is not intended to limit the source code as the logical idle symbol Logical_Idle. In another exemplary embodiment, the source code may be another fixed symbol rather than the logical idle symbol Logical_Idle.

In an exemplary embodiment, the digital code generator 102 generates a scramble/descramble seed reset symbol SYNC_OS, a clock compensation symbol SKP_OS or a fixed symbol (e.g., the logical idle symbol Logical_Idle). The code checker 114 receives a restored code and checks whether the restored code is any of the scramble/descramble seed reset symbol SYNC_OS, the clock compensation symbol SKP_OS and the fixed symbol (e.g., the logical idle symbol Logical_Idle). When the restored code matches any of the scramble/descramble seed reset symbol SYNC_OS, the clock compensation symbol SKP_OS and the fixed symbol (e.g., the logical idle symbol Logical_Idle), the count of the error counter 116 is not changed. Otherwise, the count of the error counter 116 is changed.

The buffer 108 for clock compensation is discussed in this paragraph. Between different series of logical idle symbol Logical_Idle, the digital code generator 102 may insert a clock compensation symbol SKP_OS to be processed by the scrambler 104, the encoder 106, and the electrical physical layer EPHY, and then output by the interface chip 100 via the transmission terminal TX and coupled back to the interface chip 100 via the reception terminal RX and processed by the electrical physical layer EPHY, the buffer 108 for clock compensation, the decoder 110, the descrambler 112, and the code checker 114. The receiving code, which is received from the reception terminal RX and converted by the electrical physical layer EPHY, and which corresponds to the clock compensation symbol SKP_OS, is buffered in the buffer 108 to compensate for the non-synchronous transmission timing. In an exemplary embodiment, the scrambler 104 and the descrambler 112 does not perform the scramble and descramble process when the digital code generator 102 outputs the clock compensation symbol SKP_OS.

Figure 3:
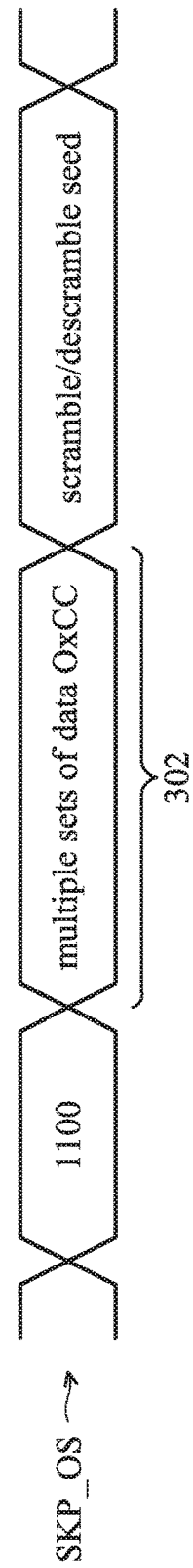
FIG. 3 depicts the structure of the clock compensation symbol SKP_OS, which includes a length-adjustable sector 302 that can be prolonged or shortened.

FIG. 3 depicts the structure of the clock compensation symbol SKP_OS, which includes a length-adjustable sector 302 that can be prolonged or shortened. A series of data 0xCC is transmitted in the length-adjustable sector 302. By being buffered in the buffer 108 for clock compensation, more or fewer sets of data 0xCC are arranged in the length-adjustable sector 302 to delay or advance the data transmission.

In an exemplary embodiment, the digital code generator 102 outputs a series of scramble/descramble seed reset symbols SYNC_OS and then outputs one clock compensation symbol SKP_OS and then outputs a series of scramble/descramble seed reset symbols SYNC_OS again.

For a USB 3.1 interface, the encoder 106 performs a 128b-to-132b encoding, the electrical physical layer EPHY raises the data rate up to 10 GT/s, and the decoder 110 performs a 132b-to-128b decoding. For other interface protocols, the function blocks shown in FIG. 1 may have corresponding designs.

Furthermore, the function blocks of the interface chip 100 of FIG. 1 may be used in other operations by changing a register.

In other exemplary embodiments, the digital code generator, the scrambler, the encoder, the buffer for clock compensation, the decoder, the descrambler, the code checker and the error counter are not limited to the architecture shown in FIG. 1. Function blocks built in the interface chip and operating based on the aforementioned concepts are within the scope of the invention.

Figure 4:
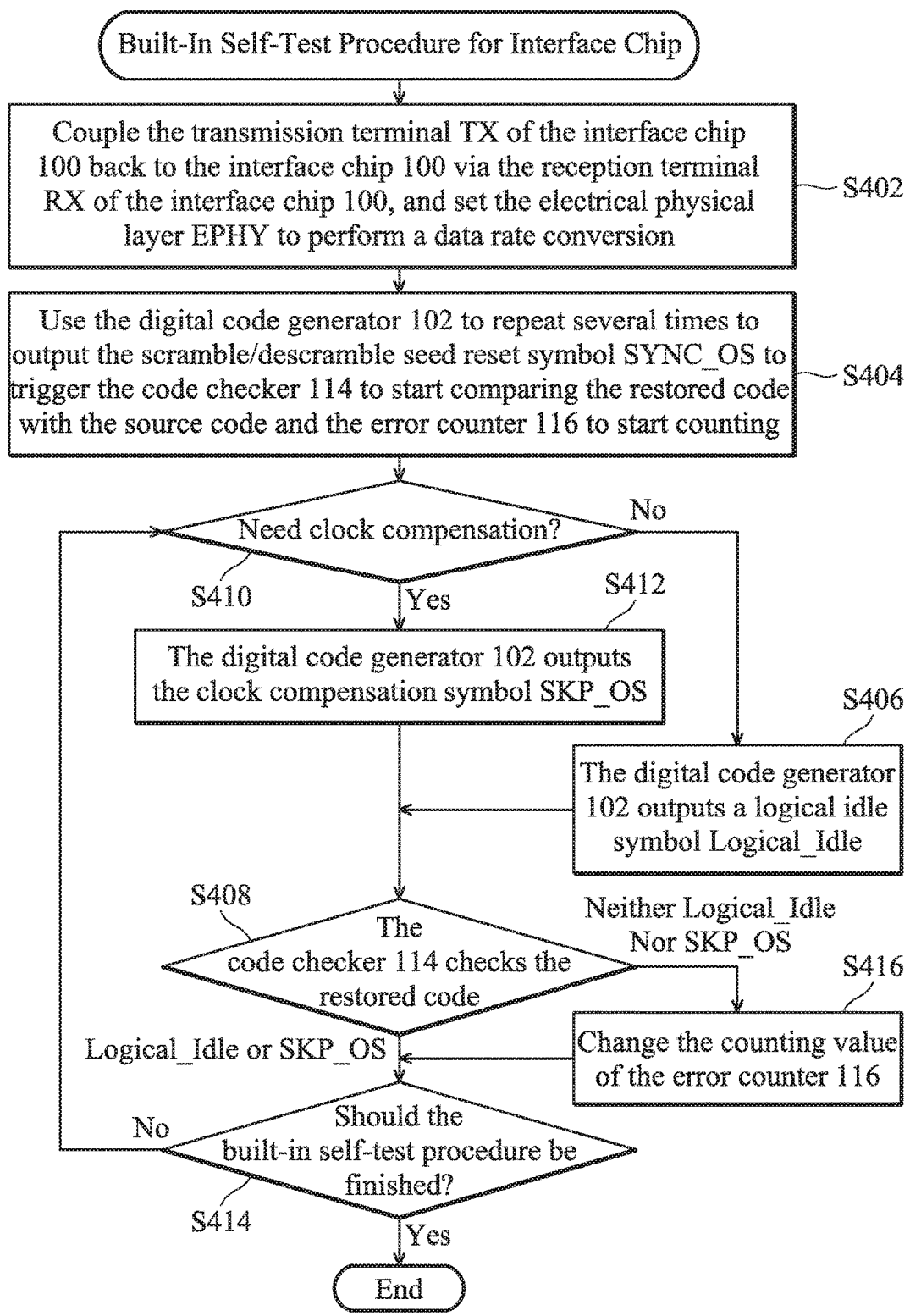
FIG. 4 is a flowchart depicting the built-in self-test procedure of the interface chip 100.

FIG. 4 is a flowchart depicting the built-in self-test procedure of the interface chip 100. In step S402, the transmission terminal TX of the interface chip 100 is coupled back to the interface chip 100 via the reception terminal RX of the interface chip 100, and the electrical physical layer EPHY is set to perform a data rate conversion. In step S404, the digital code generator 102 repeats the generation of the scramble/descramble seed reset symbol SYNC_OS several times, to trigger the code checker 114 to start comparing the restored code with the source code and the error counter 116 to start counting. In another exemplary embodiment of step S404, the digital code generator 102 triggers the code checker 114 and the error counter 116 by outputting at least one scramble/descramble seed reset symbol SYNC_OS. The scramble and descramble seeds of the scrambler 104 and the descrambler 112 are reset in accordance with the scramble/descramble seed reset symbol SYNC_OS. In an exemplary embodiment, after the code checker 114 correspondingly detects the scramble/descramble seed reset symbol SYNC_OS several times, the code checker 114 starts comparing the restored code with the source code and the error counter 116 starts counting. The code checker 114 and the error counter 116 may be triggered in another way to start comparing the restored code with a specific source code and start counting. For example, the code checker 114 and the error counter 116 may be triggered to start comparing the restored code with a specific source code and start counting after the digital code generator 102 is enabled. After the code checker 114 starts comparing the restored code with the source code and the error counter 116 starts counting in step S404, step S410 is performed to determine whether clock compensation is called for. When there is a need for clock compensation, step S412 is performed and the digital code generator 102 outputs the clock compensation symbol SKP_OS. When clock compensation is not required, step S406 is performed and the digital code generator 102 outputs a logical idle symbol Logical_Idle (which is the fixed self-test symbol in this exemplary embodiment). In step S408, the code checker 114 checks the restored code. When the restored code matches the logical idle symbol Logical_Idle or the clock compensation symbol SKP_OS, step S414 is performed to check whether the built-in self-test procedure should be finished (e.g., reaching a time limit) and the procedure ends or proceeds to step S410. When the restored code is neither the logical idle symbol Logical_Idle nor the clock compensation symbol SKP_OS, step S416 is performed to change (e.g., increase or decrease progressively) the count of the error counter 116 and step S414 is performed again.

Built-in self-test techniques in an interface chip based on the aforementioned concepts are believed to be within the scope of the invention. A built-in self-test method for an interface chip is also an exemplary embodiment of the disclosure.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interface chip, comprising:
   an electrical physical layer, providing a signal to a transmission terminal of the interface chip, and receiving a signal from a reception terminal of the interface chip;
   a digital code generator, generating a source code;
   a scrambler, scrambling the source code to generate a scrambled code;
   an encoder, encoding the scrambled code and outputting an encoded and scrambled code to the electrical physical layer to be converted to the signal that is provided to the transmission terminal by the electrical physical layer;
   a decoder, decoding a receiving code to generate a decoded code, wherein the receiving code is received from the electrical physical layer that converts the signal received from the reception terminal to the receiving code;
   a descrambler, descrambling the decoded code to generate a restored code;
   a code checker, receiving the restored code, wherein the code checker compares the restored code with the source code obtained directly from the digital code generator, without being transmitted and returned back by the transmission terminal, and the reception terminal to determine whether the restored code matches the source code when the transmission terminal is directly coupled back to the interface chip via the reception terminal; and
   a buffer for clock compensation, wherein the receiving code from the electrical physical layer is conveyed to the decoder through the buffer for clock compensation;

wherein a variety of test patterns are derived by the scrambler corresponding to the source code;

the digital code generator repeats the generation of a fixed symbol as the source code several times, and inserts a clock compensation symbol between different series of the fixed symbol to be processed by the scrambler, the encoder, and the electrical physical layer, and then output by the interface chip via the transmission terminal and coupled back to the interface chip via the reception terminal and processed by the electrical physical layer, the buffer for clock compensation, the decoder, the descrambler and the code checker; and the receiving code corresponding to the clock compensation symbol is adjusted in the buffer for clock compensation.

2. The interface chip as claimed in claim 1, further comprising:

an error counter, outputting a count, wherein:

the error counter changes the count when the restored code does not match the source code; and the error counter keeps the count when the restored code matches the source code.

3. The interface chip as claimed in claim 2, wherein:

the digital code generator outputs at least a scramble/descramble seed reset symbol to reset scramble and descramble seeds of the scrambler and the descrambler when the transmission terminal is coupled back to the interface chip via the reception terminal.

4. The interface chip as claimed in claim 3, wherein:

when the transmission terminal is coupled back to the interface chip via the reception terminal and the digital code generator repeats the generation of the scramble/descramble seed reset symbol several times, and the code checker correspondingly detects the scramble/descramble seed reset symbol several times, the code checker starts comparing the restored code with the source code and the error counter starts counting.

5. The interface chip as claimed in claim 3, wherein:

when the transmission terminal is coupled back to the interface chip via the reception terminal, the code checker starts comparing the restored code with the source code and the error counter starts counting after the digital code generator is enabled.

6. The interface chip as claimed in claim 3, wherein:

when the transmission terminal is coupled back to the interface chip via the reception terminal and the digital code generator repeats the generation of the scramble/descramble seed reset symbol several times, the code checker starts comparing the restored code with the source code and the error counter starts counting.

7. The interface chip as claimed in claim 2, wherein:

after the error counter is enabled, the digital code generator repeats the generation of a fixed symbol as the source code several times.

8. A built-in self-test method for an interface chip, comprising:

coupling a transmission terminal of the interface chip back to the interface chip via a reception terminal of the interface chip;

using a digital code generator of the interface chip to generate a source code;

using a scrambler of the interface chip to scramble the source code to generate a scrambled code;

using an encoder of the interface chip to encode the scrambled code to generate an encoded and scrambled code;

conveying the encoded and scrambled code to an electrical physical layer of the interface chip to be converted to a signal that is provided to the transmission terminal and output from the interface chip and then directly coupled back to the interface chip via the reception terminal and converted to a receiving code by the electrical physical layer;

using a decoder of the interface chip to decode the receiving code to generate a decoded code;

using a descrambler of the interface chip to descramble the decoded code to generate a restored code;

using a code checker of the interface chip to compare the restored code with the source code obtained directly from the digital code generator, without being transmitted and returned back by the transmission terminal, and the reception terminal to determine whether the restored code matches the source code; and conveying the receiving code from the electrical physical layer to the decoder through a buffer for clock compensation, wherein a variety of test patterns are derived by the scrambler corresponding to the source code, the digital code generator repeats the generation of a fixed symbol as the source code several times, and inserts a clock compensation symbol between different series of the fixed symbol to be processed by the scrambler, the encoder, and the electrical physical layer, and then output by the interface chip via the transmission terminal and coupled back to the interface chip via the reception terminal and processed by the electrical physical layer, the buffer for clock compensation, the decoder, the descrambler and the code checker; and the receiving code corresponding to the clock compensation symbol is adjusted in the buffer for clock compensation.

9. The built-in self-test method as claimed in claim 8, further comprising:

providing an error counter; and changing a count of the error counter when the restored code does not match the source code; and keeping the count of the error counter when the restored code matches the source code.

10. The built-in self-test method as claimed in claim 9, wherein:

the digital code generator outputs at least a scramble/descramble seed reset symbol to reset scramble and descramble seeds of the scrambler and the descrambler when the transmission terminal is coupled back to the interface chip via the reception terminal.

11. The built-in self-test method as claimed in claim 10, wherein:

when the transmission terminal is coupled back to the interface chip via the reception terminal and the digital code generator repeats the generation of the scramble/descramble seed reset symbol several times, and the code checker correspondingly detects the scramble/descramble seed reset symbol several times, the code checker starts comparing the restored code with the source code and the error counter starts counting.

12. The built-in self-test method as claimed in claim 10, wherein:

when the transmission terminal is coupled back to the interface chip via the reception terminal, the code checker starts comparing the restored code with the source code and the error counter starts counting after the digital code generator is enabled.

13. The built-in self-test method as claimed in claim 10, wherein:
when the transmission terminal is coupled back to the interface chip via the reception terminal and the digital code generator repeats the generation of the scramble/descramble seed reset symbol several times, the code checker starts comparing the restored code with the source code and the error counter starts counting.

14. The built-in self-test method as claimed in claim 9, wherein:
after the error counter is enabled, the digital code generator repeats the generation of a fixed symbol as the source code several times.

15. An interface chip, comprising:
a digital code generator, generating a source code;
a code checker, receiving a restored code and the source code, wherein the code checker compares the restored code with the source code obtained directly from the digital code generator, without being transmitted and returned back by the transmission terminal, and the reception terminal to determine whether the restored code matches the source code when a transmission terminal of the interface chip is directly coupled back to the interface chip via a reception terminal of the interface chip; and
a buffer for clock compensation, wherein the receiving code from the electrical physical layer is conveyed to the decoder through the buffer for clock compensation, wherein:
the source code is scrambled and encoded and then output from the interface chip via the transmission terminal and coupled back to the interface chip via the reception terminal and then decoded and descrambled to the restored code;
a variety of test patterns are derived corresponding to the source code by the scrambling the source code;
the digital code generator repeats the generation of a fixed symbol as the source code several times, and inserts a clock compensation symbol between different series of the fixed symbol to be processed by the scrambler, the encoder, and the electrical physical layer, and then output by the interface chip via the transmission terminal and coupled back to the interface chip via the reception terminal and processed by the electrical physical layer, the buffer for clock compensation, the decoder, the descrambler and the code checker; and
the receiving code corresponding to the clock compensation symbol is adjusted in the buffer for clock compensation.

16. The interface chip as claimed in claim 15, further comprising:
an error counter, outputting a count,
wherein:
the error counter changes the count when the code checker determines that the restored code does not match the source code; and
the error counter keeps the count when the code checker determines that the restored code matches the source code.

17. The interface chip as claimed in claim 16, wherein:
the digital code generator outputs at least one scramble/descramble seed reset symbol to reset scramble and descramble seeds of a scrambler and a descrambler of the interface chip when the transmission terminal is coupled back to the interface chip via the reception terminal.

\* \* \* \* \*